United States Patent [19]

Graves

[11] 4,364,793

[45] Dec. 21, 1982

[54] METHOD OF ETCHING SILICON AND POLYSILICON SUBSTRATES

[76] Inventor: Clinton G. Graves, 241 Heather Pl., Danville, Calif. 94526

[21] Appl. No.: 297,138

[22] Filed: Aug. 28, 1981

[51] Int. Cl.³ .................. H01L 21/306; B44C 1/22; C03C 15/00
[52] U.S. Cl. .................................. 156/643; 156/646; 156/657; 156/662; 204/192 E; 252/79.1
[58] Field of Search ............ 156/643, 646, 657, 659.1, 156/662, 645; 204/164, 192 E; 252/79.1; 427/38, 39

[56] References Cited

U.S. PATENT DOCUMENTS

| | | | |
|---|---|---|---|
| 3,679,502 | 7/1972 | Hays | 156/17 |
| 3,971,684 | 7/1976 | Muto | 156/13 |
| 4,069,096 | 1/1978 | Reinberg | 156/643 |
| 4,094,732 | 6/1978 | Reinberg | 156/643 |
| 4,214,946 | 7/1980 | Forget et al. | 156/643 |
| 4,255,230 | 3/1981 | Zajac | 156/643 |
| 4,314,875 | 2/1982 | Flamm | 156/643 |

*Primary Examiner*—William A. Powell

[57] ABSTRACT

A method for etching silicon or polysilicon substrates wherein the substrates are exposed to a plasma formed by a conventional etchant enhanced by a metal halide.

5 Claims, No Drawings

METHOD OF ETCHING SILICON AND POLYSILICON SUBSTRATES

DESCRIPTION

1. Technical Field

The invention relates to the processing of semiconductor materials and more particularly to a process for uniformly etching a silicon or polysilicon substrate at low temperature.

2. Background Art

In manufacturing semiconductor integrated circuits, it is common to use various etching processes for removing polysilicon and silicon. For example, $SF_6$, $CCl_2F_2$, $CF_4$ are well known gases which are ionized and used in plasma etching machines. A well-known and widely accepted plasma etching machine is shown in U.S. Pat. No. 4,094,732 to A. R. Reinberg. The Reinberg patent discloses use of $CCl_4$ as an active gas in forming a plasma.

An important step in the manufacture of semiconductor devices is the removal of any backside junctions and the thinning of the silicon substrate prior to final mounting of a device on a carrier. In the case of a power device, the current a device can handle is a function of the heat a junction can dissipate. For heat dissipation purposes, it is desirable to have a thin substrate so that a heat sink can be placed in close proximity to the junction.

Typically, a wafer must be at least 10-20 mils thick at the start of the manufacturing process to withstand handling which occurs as the wafer is moved from process to process during the manufacturing. At the end of the manufacturing process the wafer may be thinned, just prior to scribing the wafer and breaking the wafer into circuit chips.

Previously, in thinning wafers, lapping and polishing machines have been used. These produce a very fine surface finish compared to other methods. However, the problem with these machines is that very thin wafers cannot withstand the mechanical vibration and abrasion imparted to the wafers. For very thin wafers, plasma etch methods are preferred. However, plasma etch methods of the prior art, using gases mentioned above, are typically rather slow, requiring typically two hours to remove one mil. To achieve a desired substrate thickness of one to two mils a typical wafer would have to be exposed to a plasma etch for between 20 to 40 hours.

Another problem which occurs with plasma etching relates to the fact that etching occurs anisotropically for polysilicon with high selectivity over silicon dioxide. It is known from the prior art that etching polysilicon with a fluorinated gas, such as $CF_4$, $CF_4+O_2$, or $SF_6$ can provide selectivity, but etching is isotropic, with some undercutting of apertures in masks which overlay the substrate and expose the substrate to the etchant. Etching with a chlorinated gas, such as $CCl_4$ or $Cl_2$, can provide an anisotropic etch, but the etch is non-uniform and with low selectivity.

Forget, et al. in U.S. Pat. No. 4,214,946 teach that a combination of $SF_6$ and $Cl_2$ diluted with a inert gas provide an anisotropic etch and high selectivity (30:1 Si/SiO$_2$). However, the erosion of photoresist is very high and maintaining critical dimensions with conventional photoresist techniques would be difficult.

In U.S. Pat. No. 4,069,096, entitled "Silicon Etching Process" granted Jan. 17, 1978, A. R. Reinberg et al. disclose a process for etching silicon including the step of contacting the silicon with a plasma derived from a gas comprising $CCl_4$, an inert gas, and a gas selected from the group consisting of $Cl_2$ and HCl.

In U.S. Pat. No. 4,255,230, entitled "Plasma Etching Process," granted Mar. 10, 1981, John Zajak discloses a process for the etching of polysilicon substrates. Briefly, a polysilicon substrate is exposed to plasma of carbon tetrachloride, chlorinated gas, fluorinated gas or a gas capable of generating both chlorinated and fluorinated plasma species. The combination of a chlorinated and fluorinated etching species substantially reduces undercutting of polysilicon substrates.

In U.S. Pat. No. 3,679,502, entitled "Gaseous Non-preferential Etching of Silicon," granted July 25, 1972, R. G. Hays discloses a silicon surface etched or polished with a gaseous mixture comprising sulfur hexafluoride $SF_6$ of high purity and a carrier gas such as hydrogen at temperatures between 960° C. and 1250° C. The sulfur hexafluoride should have a low nitrogen concentration with a preferred nitrogen concentration being less than 200 parts per million by weight.

In U.S. Pat. No. 3,971,684, entitled "Etching Thin Film Circuits and Semiconductor Chips," granted July 27, 1976, S. Y. Muto discloses a method of etching either thin film circuits or semiconductor chips which is capable of producing extremely well-defined edges on etched materials, while at the same time achieving rapid etching rates. According to the method a gas or gas mixture whose constituent ions are chemically reactive is placed in a container along with a cathode electrode and an anode electrode. A surface to be etched is covered by a suitable mask and mounted on one of the electrodes, e.g., the cathode which is negative-biased relative to the remaining electrode, e.g., by applying an RF biasing signal. An electric field is thus established in the region between the cathode and the anode, and serves to dissociate the reactive gas. Chemically reactive gas ions are attracted to the cathode and thereby impinge on the sample to be etched. Apparently, the surface is etched both by chemical interaction with the active ions and by the momentum transfer of the ions impinging on the surface. By virtue of the electric field attracting ions to the cathode, the ions impinge on the surface to be etched predominantly in a direction perpendicular to that surface, so that the process produces well-defined vertically etched sidewalls. Chemically reactive gases such as $SF_6$ or $CCl_2F_2$ may be employed, however, $CF_4$ is preferred.

An object of the invention was to find an etchant gas and process suitable for very rapid etching of polysilicon and silicon, so that the backside of silicon wafers may be thinned to one or two mils in approximately 10 or 20 minutes at high etch power.

Another object of the invention was to find an etchant gas and process suitable for a lower rate of etching of polysilicon on a front surface of a wafer, where the etch rate is uniform and anisotropic, without attacking photoresist and with high selectivity over SiO$_2$.

DISCLOSURE OF INVENTION

The above objects have been achieved with the discovery that silicon wafers subjected to plasma ion etching can be thinned if, in addition to the normal etchant gas, such as $NF_3$ or $SF_6$ a metal halide is introduced. The metal halide and the etchant gas enhance the volatility of silicon. The result is a very rapid, uniform, isotropic etch which may be carried out at low temperature, i.e., approximately 100° C. An etch rate of 25 to 50 microns per minute is achieved on the backside of silicon wafers, with a change in substrate thickness from 15 to 20 mils down to one or two mils within approximately 15 minutes.

A similar process may be used for anisotropic etching of polysilicon with high selectivity over $SiO_2$ and erosion of photoresist. The gas mixture is essentially the same, but the operation is carried out at a reduced power level.

BEST MODE FOR CARRYING OUT THE INVENTION

The present invention utilizes plasma etching for thinning silicon semiconductor wafers. Such etching takes place in a plasma reactor, preferably of the parallel plate type described in the previously mentioned patent to Reinberg. In accord with the present invention, silicon wafers are first treated with photoresist on upper surfaces on which circuits have been deposited. This protects previously constructed circuits during the thinning etch. The protected circuits are then mounted upside down on a carrier, with the photoresist coating contacting the carrier. The carrier is placed in a plasma reactor. The reactor is then pumped down with the wafers inside to reactor pressure which is typically on the order of thirty microns.

Next, the standard etchant gas, such as $NF_3$ is injected at a flow rate of between ten to one hundred cc per minute measured at atmospheric pressure. Gas injection is continuous from start to finish of the operation. Simultaneously, $AlCl_3$ or $Al_2Cl_6$ is present, injected, or inserted in the reactor. The aluminum chloride may be gaseous aluminum chloride, particulate, or solid aluminum chloride.

Pressure is stabilized at approximately 150 microns. A plasma is then initiated between the electrodes at a radio frequency, typically between 100 KHz to 13 MHz. Once the plasma is established, etching will occur in the following manner. The excited fluoride atoms enhanced by the $AlCl_3$ or $Al_2Cl_6$ will attack and vaporize silicon. Chloride or fluoride, with or without aluminum, will not rapidly etch the silicon. Moreover, chloride with fluoride will not etch the silicon at a sufficiently fast rate, although etching occurs at a slow rate, as known in the prior art.

Fast etching, with a standard etchant and aluminum chloride, continues until a desired silicon wafer thickness is achieved. At that time the plasma is quenched by turning off the power. The precise speed of etching depends upon the power applied to the reactor, which may vary between 250 watts and 5000 watts or more.

For fast etching, power levels above 5000 watts are used to achieve high plasma densities. An advantage of the described etching process is that a uniform or isotropic etch is produced, even though the backside of the wafer has small high spots and low spots. The etch preferentially attacks the high spots which tend to be closer to the center of the plasma. The opposite effect occurs with respect to low spots. It is believed that metal halides, such as aluminum chloride catalyze the action of standard etchants.

On termination of etching the reactor is vented and the wafer holder is removed from the etching reactor. The silicon wafers are removed from the holder and photoresist is dissolved from the front side of the wafers in the usual manner. The wafers are now scribed and broken. The thin substrate chips are then mounted. The invention is not limited to wafers. Other substrates of similar material could be treated.

By operating at reduced power levels of between 200–500 watts, anisotropic etching of polysilicon can be carried out at low plasma densities using metal halides in combination with the standard etchant gases at a molecular concentration of a few percent halide to the etchant. An etch rate of 3000 A° per minute can be achieved with high selectivity over $SiO_2$.

I claim:

1. A method for etching silicon or polysilicon substrates comprising,
supporting silicon or polysilicon substrates in a plasma reactor, the substrates having a surface exposed to a reactive plasma etch within a region of said reactor,
injecting gaseous aluminum chloride to the plasma region, and
terminating the plasma etch after a desired depth of silicon or polysilicon has been removed from the substrate.

2. The method of claim 1 wherein the aluminum chloride is derived from particulate aluminum chloride.

3. A method for etching silicon or polysilicon substrates comprising,
supporting silicon or polysilicon substrates in a plasma reactor, the substrates having a surface exposed to a reactive plasma etch within a region of said reactor,
placing solid aluminum chloride in the plasma region, and
terminating the plasma etch after a desired depth of silicon or polysilicon has been removed from the substrate.

4. The method of claim 1 or 3 further defined by providing a high plasma density for an isotropic etch.

5. The method of claim 1 or 3 further defined by providing a low plasma density for an anisotropic etch.

* * * * *